US006940727B2

(12) United States Patent  
Dobbs et al.

(10) Patent No.: US 6,940,727 B2
(45) Date of Patent: Sep. 6, 2005

(54) CARD GUIDE THAT COMPRISES CARD GUIDE PORTIONS THAT SERVE TO GUIDE A CIRCUIT BOARD INTO A CHASSIS

(75) Inventors: Robert William Dobbs, Granite Bay, CA (US); Stephan Karl Barsun, Davis, CA (US); Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 44 days.

(21) Appl. No.: 10/681,841

(22) Filed: Oct. 8, 2003

(65) Prior Publication Data

US 2005/0078461 A1 Apr. 14, 2005

(51) Int. Cl.[7] .................................................. H05K 7/14
(52) U.S. Cl. ....................... 361/756; 361/741; 361/802; 29/831
(58) Field of Search ................................ 361/741, 756, 361/802, 752, 801, 797, 796, 798, 754, 755, 728, 730; 174/50, 52.1; 211/41.17; 29/830, 831

(56) References Cited

U.S. PATENT DOCUMENTS

| 4,022,326 | A | * | 5/1977 | Marconi ................... 211/41.17 |
| 4,075,683 | A | * | 2/1978 | Johansson et al. .......... 361/802 |
| 4,532,576 | A |   | 7/1985 | Reimer |
| 4,896,777 | A | * | 1/1990 | Lewis ...................... 211/41.17 |
| 5,236,094 | A |   | 8/1993 | Condie |
| 5,408,382 | A | * | 4/1995 | Schultz et al. .............. 361/686 |
| 6,195,259 | B1 | * | 2/2001 | Whitman et al. ........... 361/725 |
| 6,313,985 | B1 | * | 11/2001 | Chen et al. ................. 361/685 |
| 6,373,712 | B1 | * | 4/2002 | Bailis et al. ................ 361/756 |
| 6,381,149 | B1 |   | 4/2002 | Megason et al. |
| 6,411,517 | B1 |   | 6/2002 | Babin |
| 6,619,766 | B1 | * | 9/2003 | Mansueto ................ 312/223.1 |
| 6,728,114 | B2 | * | 4/2004 | Serjack et al. .............. 361/802 |

FOREIGN PATENT DOCUMENTS

| GB | 1503781 | 5/1975 |
| JP | 01030295 | 2/1989 |

* cited by examiner

*Primary Examiner*—Kamand Cuneo
*Assistant Examiner*—Dameon E. Levi

(57) ABSTRACT

A card guide of an apparatus in one example comprises a plurality of card guide portions that serve to guide a circuit board into a chassis. The plurality of card guide portions comprise a first card guide portion and a second card guide portion. The first card guide portion serves to guide the circuit board substantially along a first direction during engagement of the circuit board with the first card guide portion. The second card guide portion serves to guide the circuit board substantially along a second direction that is nonlinear with the first direction during engagement of the circuit board with the second card guide portion.

35 Claims, 3 Drawing Sheets

CARD GUIDE THAT COMPRISES CARD GUIDE PORTIONS THAT SERVE TO GUIDE A CIRCUIT BOARD INTO A CHASSIS

BACKGROUND

A card guide in one example guides a circuit board into a chassis for installation of the circuit board into the chassis. The chassis in one example comprises a card cage and/or computer case. The card guide comprises an installation path for the circuit board from the front of the chassis to the back of the chassis. For example, the circuit board slides on the card guide from the front of the chassis to a backplane at the back of the chassis. The circuit board comprises an electrical connector that couples the circuit board with the backplane.

The card guide comprises a straight channel for the circuit board to slide into the chassis and engage with the backplane. An edge of the circuit board in one example slides into the chassis on the straight channel. The chassis in one example comprises a lip at a circuit board entrance at the front of the chassis. Behind the lip is an open space within the chassis. The straight channel guides the circuit board into the chassis so that contact is avoided between the lip and the circuit board. The chassis in one example comprises a plurality of card guides to support a plurality of circuit boards. The number of circuit boards and the size of components on the circuit boards are limited by the size of the chassis.

SUMMARY

The invention in one implementation encompasses an apparatus. The apparatus comprises a card guide that comprises a plurality of card guide portions that serve to guide a circuit board into a chassis. The plurality of card guide portions comprise a first card guide portion and a second card guide portion. The first card guide portion serves to guide the circuit board substantially along a first direction during engagement of the circuit board with the first card guide portion. The second card guide portion serves to guide the circuit board substantially along a second direction that is nonlinear with the first direction during engagement of the circuit board with the second card guide portion.

Another implementation of the invention encompasses an apparatus. The apparatus comprises a circuit board that comprises one or more card guide pins. One or more of the one or more card guide pins slide through one or more bends in a card guide of a chassis to guide the circuit board around an obstacle in the chassis.

Yet another implementation of the invention encompasses an apparatus. The apparatus comprises means for guiding a circuit board substantially along a first direction during engagement of the circuit board with the means for guiding the circuit board substantially along the first direction. The apparatus comprises means for guiding the circuit board substantially along a second direction that is nonlinear with the first direction during engagement of the circuit board with the means for guiding the circuit board substantially along the second direction. The means for guiding the circuit board substantially along the second direction serves to guide the circuit board to an engagement with a chassis.

A further implementation of the invention encompasses a method. A first portion of a card guide is positioned to guide a circuit board into a chassis in a first direction to prevent contact between the circuit board and the chassis. A second portion of the card guide is positioned to guide the circuit board into the chassis in a second direction that is nonlinear with the first direction to engage a connection component of the circuit board with a backplane in the chassis.

DESCRIPTION OF THE DRAWINGS

Features of exemplary implementations of the invention will become apparent from the description, the claims, and the accompanying drawings in which:

DETAILED DESCRIPTION

Referring to the BACKGROUND section above, the straight channel is unable to guide the circuit board into the open space behind the lip. As one shortcoming, the straight channel that guides the circuit board into the chassis prevents the circuit board from occupying the open space. Additional circuit boards or larger components on the circuit boards could fit within the chassis if the additional circuit boards or larger components on the circuit boards could fill the open space behind the lip of the chassis. As another shortcoming, the straight channel that guides the circuit board into the chassis prevents additional circuit boards or larger components on the circuit boards from fitting within the chassis.

Figure 1:
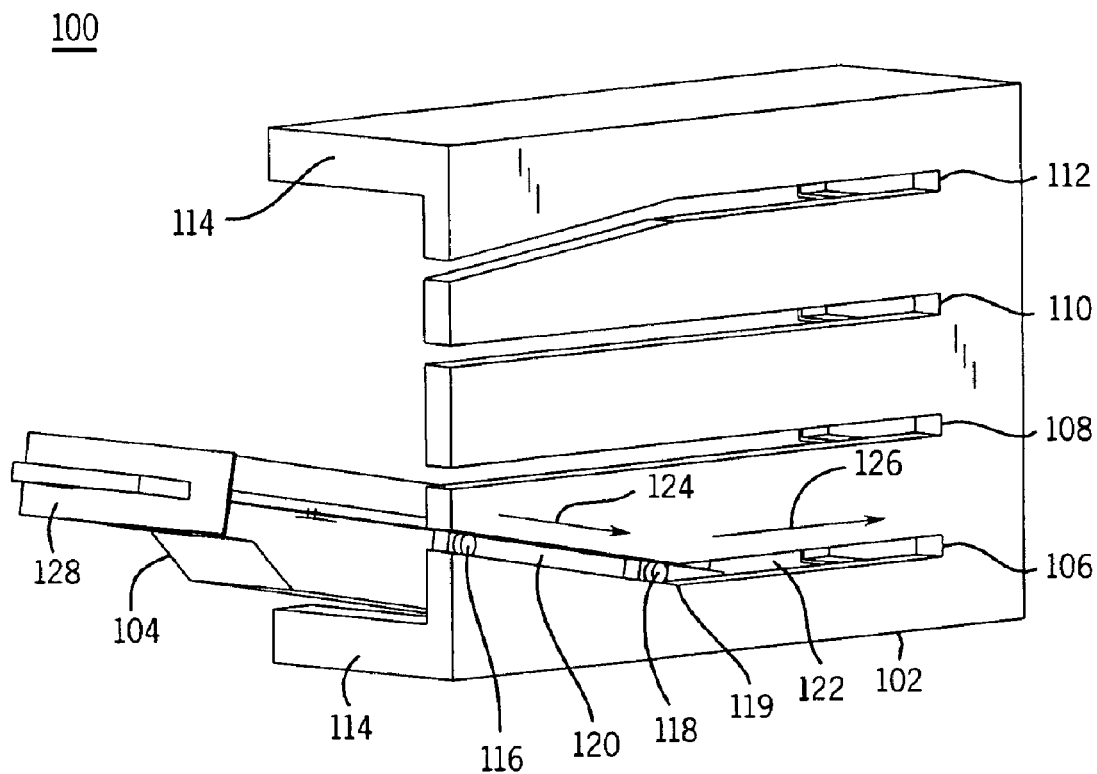
FIG. 1 is a representation of an exemplary implementation of an apparatus that comprises a chassis and one or more circuit boards.

Turning to FIG. 1, an apparatus 100 in one example comprises a plurality of components such as hardware components. A number of such components can be combined or divided in one example of the apparatus 100. The apparatus 100 in one example comprises any (e.g., horizontal, oblique, or vertical) orientation, with the description and figures herein illustrating one exemplary orientation of the apparatus 100, for explanatory purposes.

Figure 3:
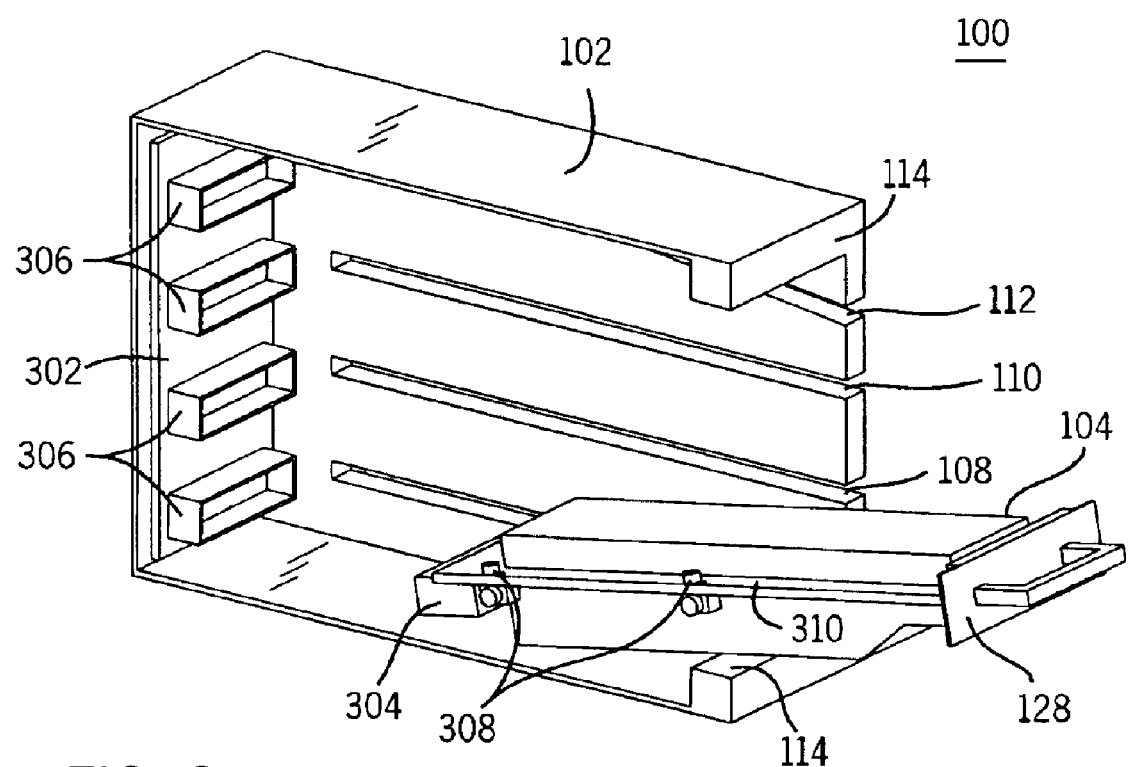
FIG. 3 is a representation of one or more connection components of the chassis and a connection component of the circuit board of the apparatus of FIG. 1.

Referring to FIGS. 1 and 3, the apparatus 100 in one example comprises a chassis 102 and one or more circuit boards 104. The chassis 102 comprises one or more card guides 106, 108, 110, and 112, one or more backplanes 302, and one or more obstacles, for example, one or more lips 114 of the chassis 102. The circuit board 104 comprises one or more card guide pins 116 and 118 and a connection component 304.

The chassis 102 in one example comprises a card cage and/or computer case. The chassis 102 holds and stores one or more circuit boards, for example, the circuit board 104. The card guide 106 serves to guide the circuit board 104 into the chassis 102. For example, the card guide 106 provides support to the circuit board 104 during installation of the circuit board 104 from the front of the chassis 102 to the back of the chassis 102. The card guides 108, 110, and 112 serve to guide additional circuit boards (e.g., analogous to the circuit board 104) into the chassis 102.

The card guides 106, 108, 110, and 112 in one example are located on an inner face of the chassis 102. For example, the card guide 106 runs along the inner face of the chassis 102 to provide an installation path for the circuit board 104. During installation of the circuit board 104 into the chassis 102, the circuit board 104 moves from the front of the chassis 102 towards the back of the chassis 102. Therefore, the card guides 106, 108, 110, and 112 may be on one or more of the side faces within the chassis 102, the bottom face within the chassis 102, or the top face within the chassis 102.

The card guides 106, 108, 110, and 112 comprise grooves and/or channels in the chassis 102. In one example, the grooves are etched out of the chassis 102 to enable the chassis 102 to receive and support the circuit board 104. In another example, the card guides 106, 108, 110, and 112 are attached to the chassis 102. For example, one or more screws couple the card guides 106, 108, 110, and 112 with the chassis 102, for example, on the inner face of the chassis 102. The groove of the card guide 106 passes through the first card guide portion 120 and the second card guide portion 122. The groove serves to guide the circuit board 104 through the first card guide portion 120 and the second card guide portion 122. For example, the groove receives and supports the card guide pins 116 and 118 of the circuit board 104.

In one example, one or more of the card guides 106, 108, 110, and 112 comprise a bend 119 in the one or more of the card guides 106, 108, 110, and 112. For example, the card guide 106 comprises the bend 119 in the installation path of the circuit board 104 into the chassis 102. A slope of the installation path in the card guide 106 changes at the bend 119 in the card guide 106. For example, the slope of the first card guide portion 120 is different than the slope of the second card guide portion 122.

In another example, the card guide 106 comprises a plurality of bends (e.g., analogous to the bend 119) in the installation path of the circuit board 104 into the chassis 102. The plurality of bends serve to guide the circuit board 104 substantially along a plurality of nonlinear directions during installation of the circuit board 104 into the chassis 102 on the card guide 106. In yet another example, the card guide 106 comprises one or more curves in the installation path. The curves serve to guide the circuit board around the lip 114. The curves are in one example are rounded. A first portion of the curve serves to guide the circuit board 104 substantially along a first direction during engagement of the circuit board 104 with the first portion of the curve. A second portion of the curve serves to guide the circuit board 104 substantially along a second direction during engagement of the circuit board with the second portion of the curve.

The card guide 106 in one example comprises the bend 119, the card guide 112 comprises a bend substantially similar to the bend 119, and the card guides 108 and 110 are straight. In one example, the installation paths of circuit boards (e.g., analogous to the circuit board 104) into the card guides 108 and 110 are free of obstacles. Therefore, the card guides 108 and 110 may be straight to allow installation of the circuit boards into the chassis 102. In another example, the installation path of the circuit board 104 comprises the lip 114. The bend 119 in the card guide 106 allows installation of the circuit board 104 into the chassis 102 around the lip 114.

The lip 114 in one example comprises one or more of an overhang, ledge, circuit board entrance, and sheet metal portion of the chassis 102. The bend 119 in one example comprises one or more curves, arcs, or turns in the card guide 106. The card guide 106 comprises an installation path shaped to guide the circuit card 104 around an obstacle in the chassis 102, for example, the lip 114 of the chassis 102. The obstacle in one example is located in the circuit board entrance of the chassis 102 or within the chassis 102. The circuit board entrance in one example comprises the front or side opening in the chassis 102 that receives the circuit board 104.

The card guide 106 comprises a plurality of card guide portions that serve to guide the circuit board 104 into the chassis 102. For example, the card guide 106 comprises a first card guide portion 120 and a second card guide portion 122. The bend 119 in the card guide 106 in one example is between the first card guide portion 120 and the second card guide portion 122.

Figure 2:
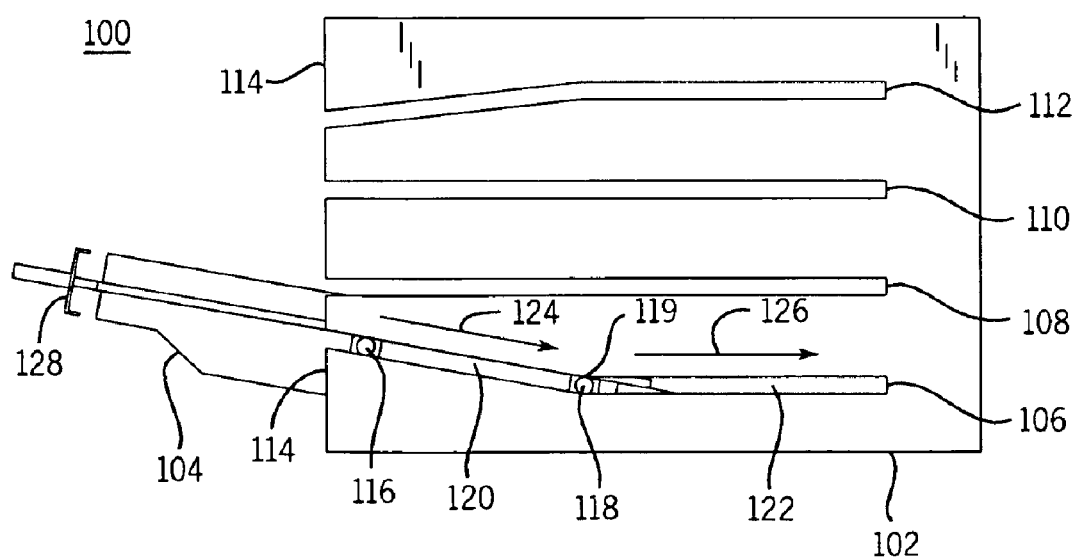
FIG. 2 is a representation of a side view of one or more card guides of the chassis and one or more card guide pins of the circuit board of the apparatus of FIG. 1.

Referring to FIGS. 1 and 2, the first card guide portion 120 serves to guide the circuit board 104 substantially along a first direction 124 during engagement of the circuit board 104 with the first card guide portion 120. The second card guide portion 122 serves to guide the circuit board 104 substantially along a second direction 126 that is nonlinear with the first direction 124 during engagement of the circuit board 104 with the second card guide portion 122. For example, the first direction 124 is oblique relative to the second direction 126.

Referring to FIGS. 1 and 3, the second card guide portion 122 serves to guide the circuit board 104 to an engagement with the backplane 302. The connection component 304 in one example comprises an electrical connector and the chassis 102 comprises a connection component, for example, the backplane 302. The backplane 302 in one example comprises one or more electrical connectors 306. The second card guide portion 122 serves to guide the circuit board 104 towards the backplane 302 to electrically couple the connection component 304 with the electrical connector 306 of the backplane 302. The circuit board 104 in one example comprises a bulkhead 128. Upon the engagement between the circuit board 104 and the backplane 302, the bulkhead 128 makes contact with the chassis 102. The bulkhead 128 contacts the chassis 102 to create a seal around the chassis 102 and to reduce electromagnetic interference ("EMI") within the chassis 102.

The bend 119 in the card guide 106 creates an angle between the first card guide portion 120 and the second card guide portion 122. For example, the bend 119 creates an angle between the first direction 124 and the second direction 126. The second card guide portion 122 serves to align a connection component 304 of the circuit board 104 with the electrical connector 306 of the backplane 302 in the chassis 102. The angle between the first card guide portion 120 and the second card guide portion 122 is based on a size of the lip 114 in the chassis 102 and a size of the circuit board 104. For example, the angle between the first card guide portion 120 and the second card guide portion 122 is based on a size of the components of circuit board 104 that protrude from the circuit board 104. The angle is set so that upon installation of the circuit board 104 into the chassis 102, the circuit board 104 is free to pass around the lip 114 and into the chassis 102 behind the lip 114. The card guide 106 promotes a tool-less installation and servicing of the circuit board 104.

In one example, the card guide pins 116 and 118 of the circuit board 104 slide in the card guide 106 to engage the circuit board 104 with the chassis 102. In another example, the card guide pins 116 and 118 of the circuit board 104 slide in the card guide 106 to disengage the circuit board 104 from the chassis 102. For example, the card guide pins 116 and 118 slide through the bend 119 in the card guide 106 to guide the circuit board 104 around the lip 114.

The card guide pins 116 and 118 protrude from one or more sides of the circuit board 104. In one example, the card guide pins 116 and 118 protrude from a first side of the circuit board 104 to engage with the card guide 106 on the first side of the circuit board 104. In another example, the card guide pins 116 and 118 protrude from the first side and a second side of the circuit board 104 to engage with the card guide 106 on the first side and the second side of the circuit board 104. The card guide pins 116 and 118 engage with the card guide 106 to provide support for the circuit board 104 and to receive guidance from the card guide 106.

In one example, one or more connection components 308 attach the card guide pins 116 and 118 with a printed circuit board portion 310 of the circuit board 104. The connection components 308 in one example comprise one or more of screws, connection pins, clips, rivets, press-fittings, press pins, through hole soldering, solder with mechanical connection, quarter-turn fasteners, swages, and snap-ins. Where the connection components 308 comprises screws, the screws couple the card guide pins 116 and 118 with circuit board 104. For example, the screws pass through holes in the printed circuit board portion 310 and into the card guide pins 116 and 118.

In another example, the card guide pins 116 and 118 are a part of the printed circuit board portion 310. For example, the card guide pins 116 and 118 and the printed circuit board portion 310 comprise a unitary construction and/or integral formation. A peripheral portion of the printed circuit board portion 310 in one example is formed into a guiding structure, for example, one or more of the card guide pins 116 and 118. The peripheral portion of the printed circuit board portion 310 attaches with a groove in the card guide 106. For example, the guiding structure comprises one or more protrusions and the card guide 106 comprises one or more grooves to receive the one or more protrusions.

The connection components 308 comprise one or more alignment components. In one example, the alignment components comprise alignment pins that mate with alignment holes in the printed circuit board portion 310. The alignment pins and alignment holes prevent rotation of the card guide pins 116 and 118 relative to the printed circuit board portion 310. For example, one of the alignment pins prevents a misalignment between the card guide pins 116 and 118 and the card guide 106. In another example, the alignment component abuts an edge of the printed circuit board portion 310 to prevent rotation of the card guide pins 116 and 118.

The card guide 106 in one example comprises a first card guide on the first side of the circuit board 104 and a second card guide on the second side of the circuit board 104. The first card guide supports the card guide pins 116 and 118 that protrude from the first side of the circuit board 104. The second card guide supports card guide pins (e.g., analogous to the card guide pins 116 and 118) that protrude from the second side of the circuit board 104. The second card guide on the second side of the circuit board 104 in one example is substantially similar to the first card guide on the first side of the circuit board 104. For example, the second card guide on the second side of the circuit board 104 comprises a wall on the side of the chassis 102 that supports the second side of the circuit board 104. The wall comprises one or more card guides (e.g., analogous to the card guides 106, 108, 110, and 112) that support the card guide pins that protrude from the second side of the circuit board 104.

An illustrative description of one exemplary operation of the apparatus 100 is now presented, for explanatory purposes. The card guide 106 in one example guides an installation of the circuit board 104 into the chassis 102. The card guide 106 is formed to guide the circuit board 104 into the chassis 102 behind the lip 114. For example, the first card guide portion 120 is positioned to guide the circuit board 104 into the chassis 102 behind the lip 114 in the first direction 124 to prevent contact between the circuit board 104 and the chassis 102.

Behind the lip 114 of the chassis 102 is an open space in the chassis 102. Using the open space in the chassis 102 for the circuit board 104 promotes an increase in a number of circuit boards (e.g., analogous to the circuit board 104) or an increase in a size of the circuit boards able to fit within the chassis 102. Therefore, the first card guide portion 120 is positioned to guide the circuit board 104 in the first direction 124 around the lip 114 and into the open space to fill the open space with a portion of the circuit board 104.

The circuit board 104 slides on the first card guide portion 120 to enter the chassis 102 on an angle based on the first direction 124. At a point on the card guide 106 where the circuit board 104 can clear the lip 114, the card guide 106 comprises the bend 119 to allow the card to move into the open space behind the lip 114. The first card guide portion 120 is positioned to guide the circuit board 104 to the second card guide portion 122. The second card guide portion 122 is positioned to guide the circuit board 104 into the chassis 102 in the second direction 126 to engage the connection component 304 of the circuit board 104 with the backplane 302 in the chassis 102.

During the installation of the circuit board 104 into the chassis 102, the card guide pins 116 and 118 of the circuit board 104 engage with the first card guide portion 120 on a first side of the bend 119. To install the circuit board 104 in the open space behind the lip 114 of the chassis 102, the card guide 106 serves to guide the circuit board 104 around the bend 119. The card guide pin 118 slides through the bend 119 in the card guide 106 to engage with the second card guide portion 122 on a second side of the bend 119. The card guide pin 118 slides on the second card guide portion 122 while the card guide pin 116 slides on the first card guide portion 120.

Figure 4:
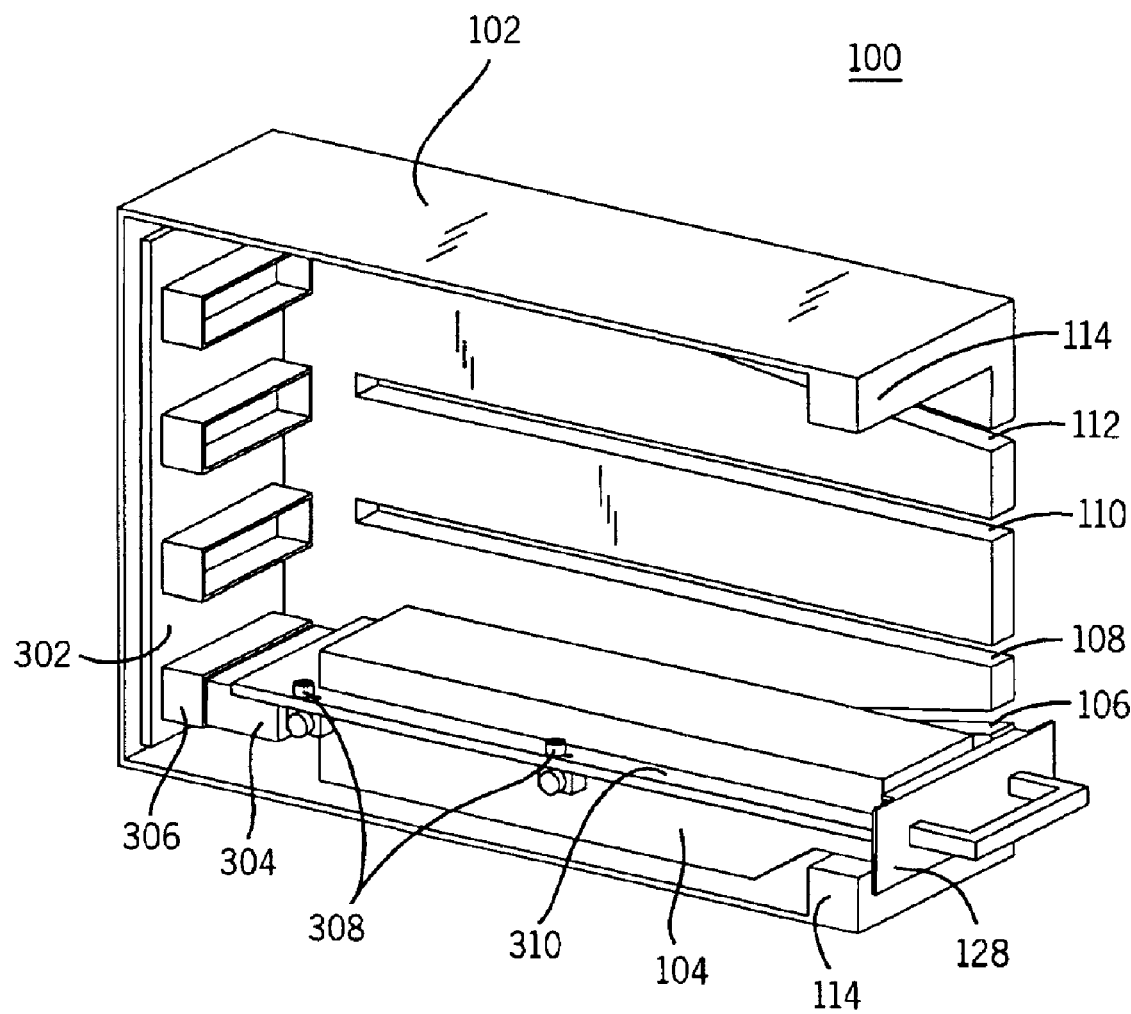
FIG. 4 is a representation of a connection component of the chassis engaged with a connection component of the circuit board of the apparatus of FIG. 1.

Referring to FIGS. 1 and 4, to engage the connection component 304 of the circuit board 104 with the backplane 302 in the chassis 102, the card guide pin 116 slides past the bend 119 in the card guide 106 to engage with the second card guide portion 122. The card guide pins 116 and 118 slide through the second card guide portion 122 in the second direction 126 until engagement of the connection component 304 of the circuit board 104 with the backplane 302. The second card guide portion 122 is aligned to guide the circuit board 104 to a straight fit with the backplane 302. Both of the card guide pins 116 and 118 in one example are supported by the second card guide portion 122 prior to engagement between the circuit board 104 and the backplane 302.

Referring to FIGS. 1 and 3, to disengage the connection component 304 of the circuit board 104 from the backplane 302 in the chassis 102, the card guide pins 116 and 118 slide along the second card guide portion 122. The card guide pin 116 slides past the bend 119 in the card guide 106 to engage with the first card guide portion 120. The card guide pin 116 slides on the first card guide portion 120 while the card guide pin 118 slides on the second card guide portion 122.

To remove the circuit board 104 from the chassis 102, the card guide pin 118 slides past the bend 119 in the card guide 106 to engage with the first card guide portion 120. The card guide pins 116 and 118 slide through the first card guide portion 120 until the circuit board 104 is free from the chassis 102. The first card guide portion 120 is aligned to guide the circuit board 104 out of the chassis 102 without contact between the circuit board 104 and the lip 114. In one example, if a second circuit board (e.g., analogous to the circuit board 104) is engaged with the chassis 102 in the card guide 108, then the second circuit board is removed from the chassis 102 to provide clearance for removal of the circuit board 104.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
a card guide that comprises a plurality of card guide portions that serve to guide a circuit board into a chassis, wherein the plurality of card guide portions comprise a first card guide portion and a second card guide portion;
wherein the first card guide portion serves to guide the circuit board substantially along a first direction during engagement of the circuit board with the first card guide portion;
wherein the second card guide portion serves to guide the circuit board substantially along a second direction that is nonlinear with the first direction during engagement of the circuit board with the second card guide portion;
wherein the chassis comprises an obstacle in a circuit board entrance of the chassis, wherein behind the obstacle is an open space in the chassis;
wherein the first card guide portion is angled to guide the circuit board in the first direction around the obstacle and into the open space to fill the open space with a portion of the circuit board.

2. The apparatus of claim 1, wherein the first card guide portion serves to guide the circuit board towards the second card guide portion.

3. The apparatus of claim 1, wherein the second card guide portion serves to guide the circuit board to an engagement of a first connector component of the circuit board with a second connection component of the chassis.

4. The apparatus of claim 3, wherein the first connector component comprises a first electrical connector of the circuit board, wherein the second connector component comprises a backplane;
wherein the second card guide portion serves to guide the circuit board towards the backplane to electrically couple the first electrical connector with the backplane.

5. The apparatus of claim 1, wherein the first direction is oblique relative to the second direction.

6. The apparatus of claim 1, wherein the second card guide portion serves to guide the circuit board in the second direction to align a first connector component of the circuit board with a second connection component of a backplane in the chassis.

7. The apparatus of claim 6, wherein the first card guide portion serves to guide the circuit board in the first direction to prevent contact between the circuit board and the chassis.

8. The apparatus of claim 1, wherein the first card guide portion and the second card guide portion promote a clearance by the circuit board of the obstacle in the circuit board entrance of the chassis.

9. The apparatus of claim 1, wherein the obstacle comprises a lip at the circuit board entrance of the chassis, wherein behind the lip is the open space in the chassis:
wherein the first card guide portion serves to guide the circuit board in the first direction around the lip and into the open space to fill the open space with the portion of circuit board.

10. The apparatus of claim 1, wherein the second card guide portion supports the circuit board during an engagement of a connection component of the circuit board with a connection component of the chassis.

11. The apparatus of claim 1 in combination with the circuit board, wherein the circuit board comprises one or more card guide pins on a side of the circuit board:
wherein during installation of the circuit board into the chassis, the card guide serves to guide the circuit board into the chassis through support of one or more of the one or more card guide pins on the side of the circuit board.

12. The apparatus of claim 1 in combination with the circuit board, wherein the circuit board comprises one or more first card guide pins on a first side of the circuit board and one or more second card guide pins on a second side of the circuit board;
wherein the card guide comprises a first card guide on the first side of the circuit board and a second card guide on the second side of the circuit board;
wherein the first card guide supports one or more of the one or more first card guide pins on the first side of the circuit board, wherein the second card guide support one or more of the one or more second card guide pins on the second side of the circuit board.

13. The apparatus of claim 1, wherein the card guide comprises an installation path for the circuit board into the chassis, wherein the card guide comprises a bend in the installation path.

14. The apparatus of claim 13, wherein during installation of the circuit board into the chassis, the circuit board slides along the first card guide portion in the installation path, through the bend in the installation path, and along the second card guide portion in the installation path.

15. The apparatus of claim 14, wherein the bend is between the first card guide portion and the second card guide portion;
wherein the bend creates an oblique angle between the first direction and the second direction.

16. The apparatus of claim 15, wherein the second card guide portion serves to align a first connector component of the circuit board with a second connection component of a backplane in the chassis;
wherein a degree of the oblique angle is based on a size of the obstacle in the circuit board entrance of the chassis and a size of the circuit board, wherein the oblique angle is set so that upon installation of the circuit board with the chassis, the circuit board is free to pass around the obstacle.

17. The apparatus of claim 1, wherein the card guide comprises a groove, wherein the groove runs through the first card guide portion and the second card guide portion;
wherein the groove serves to guide the circuit board through the first card guide portion and the second card guide portion.

18. The apparatus of claim 17 in combination with the circuit board, wherein the circuit board comprises one or more card guide pins, wherein one or more of the one or more card guide pins engage with the grove to couple the circuit board with the card guide.

19. The apparatus of claim 17 in combination with the circuit board, wherein the circuit board comprises one or more card guide pins, wherein one or more of the one or more card guide pins slide in the groove to guide the circuit board into the chassis.

20. The apparatus of claim 1, wherein the card guide comprises an installation path for the circuit into the chassis, wherein the card guide comprises a plurality of bends in the installation path;
   wherein the plurality of bends serve to guide the circuit board substantially along a plurality of non-linear directions during installation of the circuit board into the chassis.

21. The apparatus of claim 1, wherein the card guide comprises an installation path for the circuit board into the chassis, wherein the card guide comprises one or more curves in the installation path;
   wherein the first card guide portion comprises a first portion of a curve of the one or more curves and the second card guide portion comprises a second portion of the curve;
   wherein the first portion of the curve serves to guide the circuit board substantially along the first direction during engagement of the circuit board with the first portion of the curve;
   wherein the second portion of the curve serves to guide the circuit board substantially along the second direction during engagement of the circuit board with the second portion of the curve.

22. An apparatus, comprising:
   a circuit board that comprises one or more card guide pins; and
   a card guide that receives one or more of the one or more card guide pins to guide the circuit board into a chassis;
   wherein the chassis comprises an obstacle in a circuit board entrance of the chassis, wherein behind the obstacle is an open space in the chassis;
   wherein the card guide comprises one or more bends, wherein one or more of the one or more card guide pins slide through the one or more bends in the card guide to guide the circuit board around the obstacle and into the open space to fill the open space with a portion of the circuit board.

23. The apparatus of claim 22, wherein one or more of the one or more card guide pins protrude from one or more sides of the circuit board;
   wherein the one or more of the one or more card guide pins that protrude from the one or more sides of the circuit board engage with the card guide to support the circuit board.

24. The apparatus of claim 22, wherein the one or more of the one or more card guide pins that slide through the one or more bends in the card guide comprise a first card guide pin and a second card guide pin on a side of the circuit board, wherein the one or more bends in the card guide comprise a bend in the card guide;
   wherein during installation of the circuit board into the chassis, the first card guide pin and the second card guide pin engage with a first card guide portion of the card guide on a first side of the bend;
   wherein the first card guide pin and the second card guide pin slide on the first card guide portion on the first side of the bend to guide the circuit board substantially along a first direction.

25. The apparatus of claim 24, wherein to guide the circuit board past the bend, the first card guide pin slides past the bend in the card guide to engage with a second card guide portion on a second side of the bend;
   wherein the first card guide pin slides on the second card guide portion on the second side of the bend while the second card guide pin slides on the first card guide portion on the first side of the bend.

26. The apparatus of claim 24, wherein to engage a connection component of the circuit board with a connection component of the chassis, the second card guide pin slides past the bend in the card guide to engage with the second card guide portion on the second side of the bend;
   wherein the first card guide pin and the second card guide pins slide on the second card guide portion on the second side of the bend substantially along a second direction that is nonlinear with the first direction until engagement of the connection component of the circuit board with the connection component of the chassis.

27. The apparatus of claim 22, wherein the card guide comprises a bend of the one or more bends to provide an installation path around the obstacle in the chassis for the circuit board;
   wherein the one or more of the one or more card guide pins slide past the bend in the card guide to prevent contact between the circuit board and the obstacle in the chassis during installation of the circuit board into the chassis.

28. An apparatus, comprising:
   means for guiding a circuit board substantially along a first direction during engagement of the circuit board with the means for guiding the circuit board substantially along the first direction; and
   means for guiding the circuit board substantially along a second direction that is nonlinear with the first direction during engagement of the circuit board with the means for guiding the circuit board substantially along the second direction;
   wherein the means for guiding the circuit board substantially along the second direction serves to guide the circuit board to engagement with a chassis;
   wherein the chassis comprises an obstacle in a circuit board entrance of the chassis, wherein behind the obstacle is an open space in the chassis;
   wherein the means for guiding the circuit board substantially along the first direction is angled to guide the circuit board in the first direction around the obstacle and into the open space to fill the open space with a portion of the circuit board.

29. The apparatus of claim 28, wherein the means for guiding the circuit board substantially along the first direction serves to guide the circuit board towards the means for guiding the circuit board substantially along the second direction.

30. The apparatus of claim 28, wherein the means for guiding the circuit board substantially along the first direction serves to guide the circuit board around the obstacle in the circuit board entrance of the chassis to prevent contact between the circuit board and the obstacle.

31. The apparatus of claim 28, further comprising:
   means for coupling the circuit board with the means for guiding the circuit board substantially along the first direction and the means for guiding the circuit board substantially along the second direction;

wherein the means for coupling the circuit board slide through the means for guiding the circuit board substantially along the first direction and the means for guiding the circuit board substantially along the second direction to the engagement with the chassis.

32. A method, comprising the steps of:

positioning a first portion of a card guide to guide a circuit board into a chassis in a first direction to prevent contact between the circuit board and the chassis; and positioning a second portion of the card guide to guide the circuit board into the chassis in a second direction that is nonlinear with the first direction to engage a connection component of the circuit board with a backplane in the chassis;

wherein the chassis comprises an obstacle in a circuit board entrance of the chassis, wherein behind the obstacle is an open space in the chassis;

wherein the step of positioning the first portion of the card guide to guide the circuit board into the chassis in the first direction to prevent contact between the circuit board and the chassis comprises the step of:

positioning the first portion of the card guide at an angle to guide the circuit board around the obstacle and into the open space to fill the open space with a portion of the circuit board.

33. The method of claim 32, wherein the circuit board comprises one or more card guide pins, the method further comprising the steps of:

engaging one or more of the one or more card guide pins with the first portion of the card guide; and sliding the one or more of the one or more card guide pins through the first portion of the card guide in the first direction and through the second portion of the card guide in the second direction to engage the connection component of the circuit board with the backplane.

34. The apparatus of claim 1, wherein the card guide is integral to the chassis or attached to an inner wall of the chassis;

wherein the card guide runs from the circuit board entrance of the chassis to a back portion of the chassis to provide an installation path for the circuit board from the circuit board entrance to an engagement with a backplane of the chassis.

35. The apparatus of claim 1, wherein the circuit board comprises a first circuit board, wherein the card guide comprises a bent card guide path, the apparatus further comprising a straight card guide path;

wherein the bent card guide path serves to guide the first circuit board around the obstacle and into the open space in the chassis;

wherein the straight card guide path serves to guide a second circuit board into the chassis without interference from the obstacle.

* * * * *